United States Patent
Koh et al.

(10) Patent No.: US 7,192,532 B2
(45) Date of Patent: Mar. 20, 2007

(54) DRY ETCHING METHOD

(75) Inventors: Akiteru Koh, Nirasaki (JP); Toshihiro Miura, Nirasaki (JP); Takayuki Fukasawa, Tokyo (JP); Akitaka Shimizu, Nirasaki (JP); Masato Kushibiki, Nirasaki (JP); Asao Yamashita, Nirasaki (JP); Fumihiko Higuchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 224 days.

(21) Appl. No.: 10/475,268

(22) PCT Filed: Feb. 27, 2002

(86) PCT No.: PCT/JP02/01785

§ 371 (c)(1),
(2), (4) Date: Apr. 1, 2004

(87) PCT Pub. No.: WO02/086957

PCT Pub. Date: Oct. 31, 2002

(65) Prior Publication Data

US 2005/0045588 A1 Mar. 3, 2005

(30) Foreign Application Priority Data

Apr. 19, 2001 (JP) ............................. 2001-121794
Apr. 23, 2001 (JP) ............................. 2001-124731
Nov. 29, 2001 (JP) ............................. 2001-364621

(51) Int. Cl.
 *C03C 25/68* (2006.01)
(52) U.S. Cl. ................... 216/58; 216/75; 438/710; 438/721; 438/724

(58) Field of Classification Search ................. 438/719, 438/721, 724, 710; 216/58, 75
See application file for complete search history.

(56) References Cited

U.S. PATENT DOCUMENTS

| 5,164,330 | A | * | 11/1992 | Davis et al. ................. 438/654 |
| 5,259,923 | A | * | 11/1993 | Hori et al. ..................... 216/66 |
| 5,492,597 | A | * | 2/1996 | Keller ......................... 438/721 |
| 5,605,601 | A | * | 2/1997 | Kawasaki .................... 438/695 |
| 6,277,763 | B1 | * | 8/2001 | Kugimiya et al. .......... 438/720 |
| 6,440,870 | B1 | * | 8/2002 | Nallan et al. ............... 438/734 |
| 6,541,164 | B1 | * | 4/2003 | Kumar et al. .................. 430/5 |
| 6,613,682 | B1 | * | 9/2003 | Jain et al. .................... 438/706 |
| 6,905,800 | B1 | * | 6/2005 | Yuen et al. ..................... 430/5 |
| 2001/0005622 | A1 | * | 6/2001 | Kim et al. ................... 438/592 |

FOREIGN PATENT DOCUMENTS

EP 0 837 497 4/1998

(Continued)

*Primary Examiner*—Duy-Vu N. Deo
*Assistant Examiner*—Binh X. Tran
(74) *Attorney, Agent, or Firm*—Oblon, Spivak, McClelland, Maier & Neustadt, P.C.

(57) ABSTRACT

A tungsten silicide layer (104) is etched by plasma etching using $Cl_2+O_2$ gas as etching gas. When etching of the tungsten silicide layer (104) is ended substantially, etching gas is switched to $Cl_2+O_2+NF_3$ and over etching is performed by plasma etching. Etching process is ended under a state where a polysilicon layer (103) formed beneath the tungsten silicide layer (104) is slightly etched uniformly. Residual quantity of the polysilicon layer (103) can be made uniform as compared with prior art and a high quality semiconductor device can be fabricated stably.

11 Claims, 10 Drawing Sheets

FOREIGN PATENT DOCUMENTS

| | | |
|---|---|---|
| JP | 6-97116 | 4/1994 |
| JP | 7-153739 | 6/1995 |
| JP | 2000-40697 | 2/2000 |
| JP | 2000-311887 | 11/2000 |
| JP | 2001-68453 | 3/2001 |

* cited by examiner

← $Cl_2 + O_2 + NF_3$

← $O_2 + NF_3$ $\leftarrow Cl_2 + O_2 + NF_3$ $\leftarrow N_2 + NF_3$

DRY ETCHING METHOD

FIELD OF THE INVENTION

The present invention relates to a dry etching method for use in fabricating semiconductor devices; and, more particularly, to a method for dry etching through a mask layer a tungsten silicide layer and a tungsten layer formed on a polysilicon layer.

BACKGROUND OF THE INVENTION

Recently, tungsten silicide and tungsten are widely used as, e.g., an electrode material of a semiconductor device. And, a polycide structure, in which metal silicide, e.g., tungsten silicide, is deposited on a polysilicon (polycrystalline silicon) layer, is widely used as a gate electrode of an MOS transistor in a semiconductor device.

For the fabrication of such a gate electrode of the polycide structure, a gate oxide ($SiO_2$) film 202, a polysilicon layer 203, a tungsten silicide layer 204 are formed sequentially in that order on a silicon substrate 201, and a patterned mask layer 205 made of, e.g., a silicon nitride film and a photoresist is formed on the tungsten silicide layer 204, as shown in FIG. 10A.

Then, the tungsten silicide layer 204 is patterned first by being etched through the mask layer 205.

A plasma etching employing an etching gas containing, e.g., $Cl_2 + O_2$ is conventionally used in such an etching process of the tungsten silicide layer 204.

Further, during the etching process of the tungsten silicide layer 204, a certain degree of an overetching is generally carried out to remove stepped portions and a certain amount of surface portion of the polysilicon layer 203 is also etched by the overetching process as shown in FIG. 10B.

And, the polysilicon layer 203 is etched after etching the tungsten silicide layer 204, so that a polycide structure having a predetermined pattern can be obtained.

As described above, a single step plasma etching process employing an etching gas containing, e.g., $Cl_2 + O_2$ is generally used during a conventional etching process of the tungsten silicide layer.

In the above-mentioned conventional method, however, it is difficult to increase the selectivity of tungsten silicide with respect to polysilicon because a patterned shape is deteriorated and residues are generated when a condition is set for enhancing the selectivity of tungsten silicide with respect to polysilicon. Thus, a large amount of the underlying polysilicon layer is etched during the overetching process and there occurs a large variation in the residual amount of polysilicon layer remaining on a wafer surface after etching (designated by R in FIG. 10B).

The above-mentioned problem is aggravated especially in a case where a shape of the patterns thus formed has a dense pattern region in which adjacent patterns are close to each other and a sparse pattern region in which adjacent patterns are spaced apart from each other.

That is to say, an etching rate of the tungsten silicide varies between the dense pattern region (a diameter of a patterned hole: the distance between adjacent patterned holes=1:0.8 to 1:1) and the sparse pattern region (a diameter of a patterned hole: the distance between adjacent patterned holes=1:10 to 1:10000). The variation of etching rate in turn causes a variation of time during which the underneath polysilicon layer is exposed. The polysilicon layer is etched more at a region where the polysilicon layer is exposed earlier, so that the residual amount of polysilicon layer is less thereat; and the polysilicon layer is etched less at a region where the polysilicon layer is exposed later, so that the residual amount of polysilicon layer is greater thereat, resulting in a large variation in the residual amount of polysilicon layer.

If the residual amount of polysilicon layer is varied a lot as described above, during a subsequent step of etching the polysilicon layer, the underlying gate oxide film is exposed earlier at a region where the polysilicon layer is left in a smaller amount than at a region where the polysilicon layer remains in a larger amount. This causes a variation of time during which the gate oxide film is exposed. As a result, an earlier-exposed region of the gate oxide film is damaged to become less adequate to serve as the gate oxide film, lowering a production yield and quality.

SUMMARY OF THE INVENTION

It is, therefore, an object of the present invention to provide a dry etching method capable of leveling residual amounts of polysilicon layers compared with the cases in the prior art to thereby reliably fabricate high quality semiconductor devices.

In accordance with the invention, there is provided an etching method including the step of etching tungsten silicide formed directly on a silicon layer by employing an etching gas containing $Cl_2$ gas, $O_2$ gas and $NF_3$ gas, wherein the etching step is completed at a state where a part of the silicon layer remains.

Further, in accordance with the invention, there is provided an etching method including the steps of etching tungsten silicide on silicon by employing an etching gas containing $Cl_2$ gas and $O_2$ gas and thereafter etching the tungsten silicide on the silicon by employing an etching gas containing $Cl_2$ gas, $O_2$ gas and $NF_3$ gas.

Still further, in accordance with the invention, there is provided an etching method, wherein a ratio of a flow rate of $O_2$ gas to that of $Cl_2$ gas (a flow rate of $O_2$ gas/a flow rate of $Cl_2$ gas) is larger at the etching step employing the etching gas containing $Cl_2$ gas, $O_2$ gas and $NF_3$ gas than at the etching step employing the etching gas containing $Cl_2$ gas and $O_2$ gas.

Still further, in accordance with the invention, there is provided an etching method, wherein a ratio of the flow rate of $O_2$ gas to that of the whole etching gas of the etching step employing the etching gas containing $Cl_2$ gas, $O_2$ gas and $NF_3$ gas is not less than 0.2 but not greater than 0.5 [$0.2 \leq$ the flow rate of $O_2$ gas/a flow rate of ($Cl_2$ gas+$O_2$ gas+$NF_3$ gas)$\leq 0.5$].

Still further, in accordance with the invention, there is provided an etching method, wherein the tungsten silicide is etched into a pattern having a dense pattern region where adjacent patterns are close to each other and a sparse pattern region where adjacent patterns are spaced apart from each other.

Still further, in accordance with the invention, there is provided an etching method including the step of etching tungsten formed directly on a silicon layer by employing an etching gas containing $N_2$ gas and $NF_3$ gas. Still further, in accordance with the invention, there is provided an etching method including the step of etching tungsten formed on a silicon layer via a barrier metal layer by employing an etching gas including $N_2$ gas and $NF_3$ gas. Still further, in accordance with the invention, there is provided an etching method, wherein the etching gas further contains $O_2$ gas.

Still further, in accordance with the invention, there is provided an etching method further including the step of etching tungsten on silicon by employing an etching gas containing $Cl_2$ gas, $O_2$ gas and $NF_3$ gas, prior to the etching step employing the etching gas containing $N_2$ gas and $NF_3$ gas.

Still further, in accordance with the invention, there is provided an etching method including the step of etching tungsten formed directly on a silicon layer by employing an etching gas containing $O_2$ gas and $NF_3$ gas. Still further, in accordance with the invention, there is provided an etching method including the step of etching tungsten formed on a silicon layer via a barrier metal layer by employing an etching gas including $O_2$ gas and $NF_3$ gas. Still further, in accordance with the invention, there is provided an etching method, wherein the tungsten is etched by using a silicon nitride layer as a mask.

Still further, in accordance with the invention, there is provided an etching method including the step of etching tungsten on silicon by employing an etching gas containing $Cl_2$ gas, $O_2$ gas and $NF_3$ gas, wherein a ratio of a flow rate of $Cl_2$ gas to that of the whole etching gas is greater than 0 but not larger than 0.125 [0<the flow rate of $Cl_2$ gas/the flow rate of ($Cl_2$ gas+$O_2$ gas+$NF_3$ gas)≦0.125].

Still further, in accordance with the invention, there is provided an etching method further including, prior to the etching step, the preceding step of etching tungsten on silicon by employing an etchant gas, wherein a ratio of a $Cl_2$ gas flow rate in the etchant gas to that of the whole etchant gas is greater than the ratio of the flow rate of $Cl_2$ gas to that of the whole etching gas.

Still further, in accordance with the invention, there is provided an etching method, wherein the preceding step and the etching step are performed by using a parallel plate plasma etching apparatus having a lower electrode on which a substrate to be processed is mounted and to which a high frequency power is applied, the high frequency power applied to the lower electrode at the etching step is greater than that at the preceding step.

Still further, in accordance with the invention, there is provided an etching method, wherein a light having a wavelength of about 578 nm or about 542 nm is detected in plasma and the preceding step and the etching step are performed according to a change of the detected light. Still further, in accordance with the invention, there is provided an etching method, wherein the tungsten is etched into a pattern having a dense pattern region where adjacent patterns are close to each other and a sparse pattern region where adjacent patterns are distant from each other.

Still further, in accordance with the invention, there is provided an etching method, wherein a barrier metal layer is placed between the silicon and the tungsten.

DETAILED DESCRIPTION OF THE PREFERRED EMBODIMENTS

Hereinafter, dry etching methods in accordance with preferred embodiments of the present invention will be described with reference to the accompanying drawings.

Figure 1A:
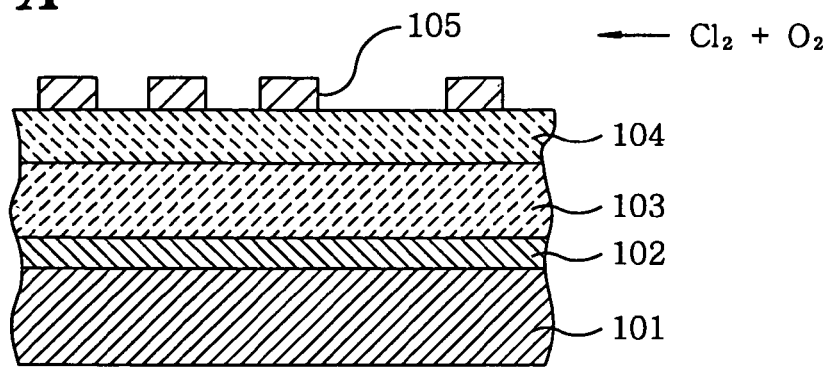
FIGS. 1A to 1C illustrate schematic cross-sectional views of a wafer explaining an embodiment of the present invention.
Figure 1B:
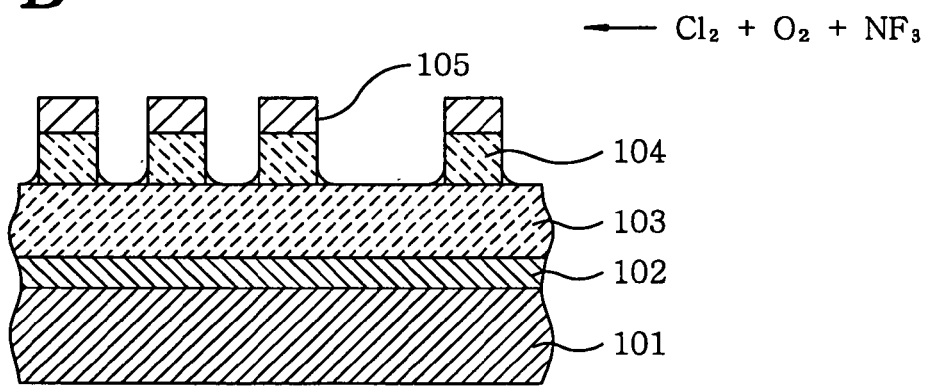
Figure 1C:
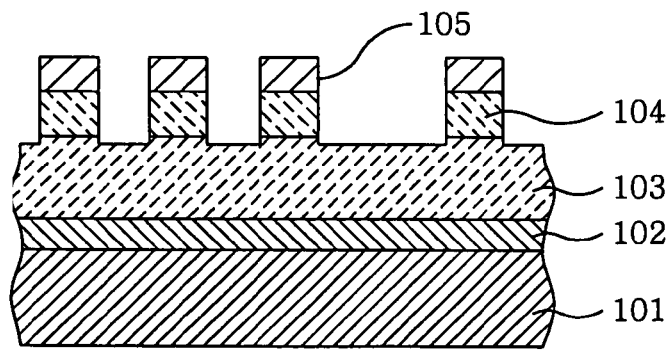

Referring to FIGS. 1A to 1C, there are illustrated enlarged schematic cross-sectional views of a semiconductor wafer (a silicon substrate) for explaining a preferred embodiment of the present invention. As shown in FIG. 1A, a gate oxide ($SiO_2$) film 102, a polysilicon layer 103 and a tungsten silicide layer 104 are formed upwardly in that order on a silicon substrate 101 and a mask layer 105 patterned in a predetermined pattern is formed on the tungsten silicide layer 104.

The mask layer 105 is formed of, for example, a silicon nitride film and a photoresist and has a dense pattern region where adjacent patterns are close to each other as shown in a left part of FIG. 1A and a sparse pattern region where adjacent patterns are spaced apart from each other as shown in a right part of FIG. 1A.

In accordance with the embodiment of the present invention, the tungsten silicide layer 104 is first etched by plasma etching employing a $Cl_2+O_2$ gas as an etching gas from a state shown in FIG. 1A.

Next, as shown in FIG. 1B, the etching gas is switched from the $Cl_2+O_2$ gas to a $Cl_2+O_2+NF_3$ gas at the moment the polysilicon layer 103 underlying the tungsten silicide layer 104 is exposed (at a state where bottom portions of the tungsten silicide layer 104 still remain). Then, the tungsten silicide layer 104 is overetched by plasma etching to be completely etched, as shown in FIG. 1C. The etching process is finished at a state where the polysilicon layer 103 underlying the tungsten silicide layer 104 is etched rather uniformly.

By doing so, etching can be done with a fine patterned shape while avoiding the generation of residues, as in the prior art single step etching method employing the $Cl_2+O_2$ etching gas. Moreover, a selectivity of the tungsten silicide with respect to the polysilicon (an etching rate of the tungsten silicide/an etching rate of the polysilicon) can be enhanced at the overetching process, so that residual amounts of the polysilicon layer 103 can be made more uniform on the surface of the silicon substrate 101 when the etching process is finished.

Figure 2:
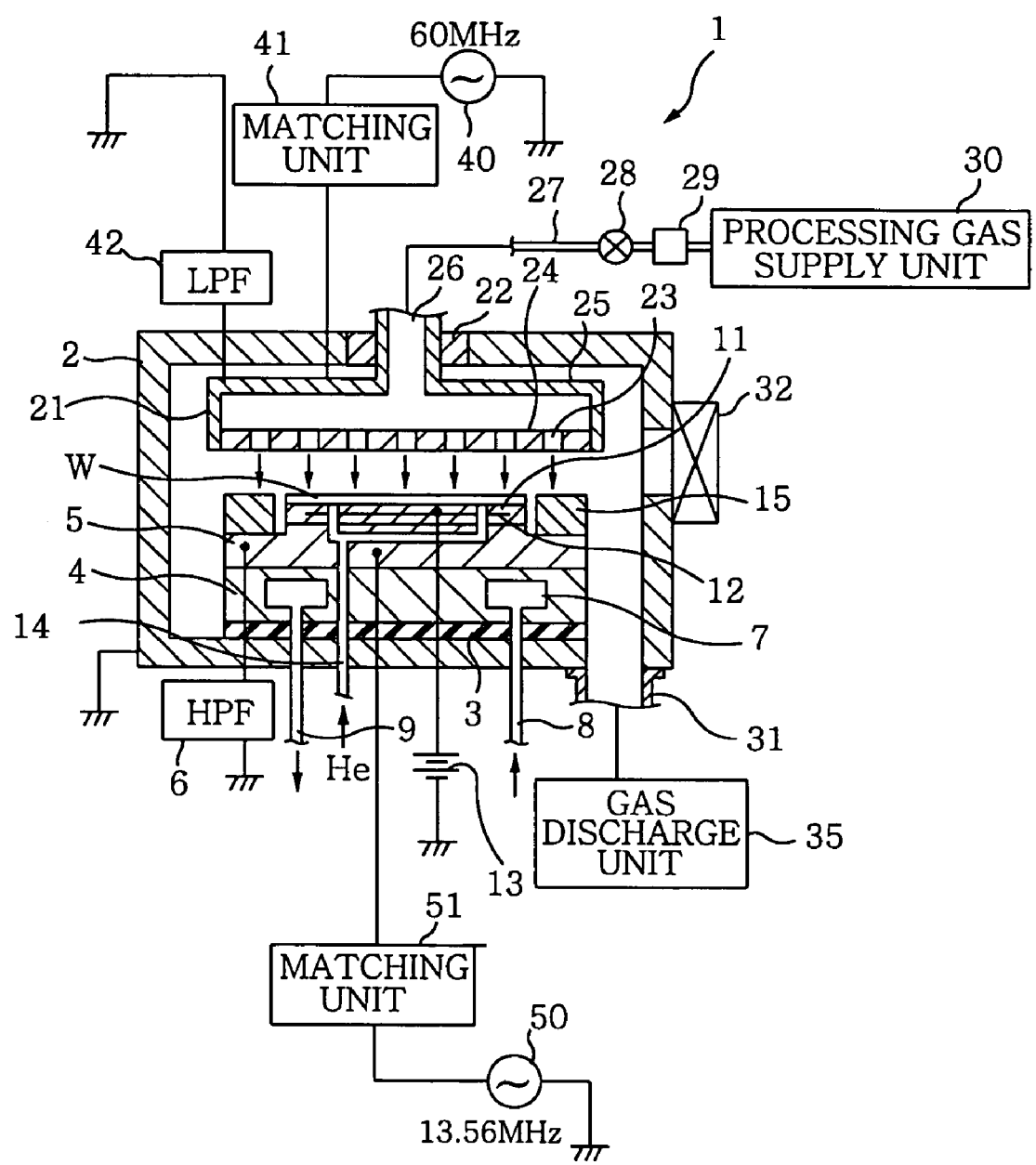
FIG. 2 shows a configuration of an exemplary apparatus for use in the embodiment of the present invention.

Referring to FIG. 2, there is illustrated a plasma treatment apparatus for use in the present invention. As shown in FIG. 2, the plasma treatment apparatus 1 is a capacitively coupled parallel plate type etching apparatus with upper and lower electrode plates parallel to each other, one side of each plate being connected to a source for plasma generation.

The etching treatment apparatus 1 includes, for example, a cylindrical chamber 2 made of aluminum whose surface is treated by anodic oxidation (alumite treated). The chamber 2 is frame grounded. Installed at a bottom portion of the chamber 2 via an insulting plate 3 such as ceramic is a substantially cylindrical susceptor support 4 for mounting a wafer W (silicon substrate 101). A susceptor 5, serving as a lower electrode, is disposed on the susceptor support 4. A high pass filter (HPF) 6 is connected to the susceptor 5.

A temperature control medium container 7 is formed inside the susceptor support 4. A temperature control medium can flow into the temperature control medium container 7 through an inlet line 8 and circulate to control the temperature of the susceptor 5.

The susceptor 5 is of a circular disk shape with an upper center region thereof being protruded. An electrostatic chuck 11 having a similar shape to that of the wafer W is disposed on the susceptor 5. The electrostatic chuck 11 is formed of an insulating material and an electrode 12 embedded therein. A DC power supply 13 supplies, e.g., a DC voltage of 1.5 kV to the electrostatic chuck 11, so that the wafer W is adhered to the electrostatic chuck 11 by a Coulomb force.

The insulating plate 3, the susceptor support 4, the susceptor 5 and the electrostatic chuck 11 are provided with a gas supply line 14 for supplying a heat transfer medium, e.g., a He gas, to a back side of the wafer W to be processed. Heat is transferred between the susceptor 5 and the wafer 4 through the heat transfer medium to allow the wafer W to be maintained at a given temperature.

A focus ring 15 of an annular shape (circular shape) is disposed around an upper periphery of the susceptor 5 to surround the wafer W mounted on the electrostatic chuck 11. The focus ring 15 is made of an insulating material, e.g., ceramic or quartz, and serves to improve the etching uniformity.

Installed above the susceptor 5 is an upper electrode 21 facing the susceptor 5 in a parallel manner, the upper electrode 21 being supported by an upper portion of the chamber 2 through an insulating member 22. The upper electrode 21 is provided with an electrode plate 24 facing the susceptor 5, the electrode plate 24 having a plurality of injection openings 23 and being formed of, e.g., carbon or quartz; and an electrode supporting member 25 which supports the electrode plate 24 and is formed of a conductive material, e.g., aluminum having its surface treated by anodic oxidation. Spacing between the susceptor 5 and the upper electrode 21 can be adjusted.

A gas inlet opening 26 is disposed at a center of the electrode supporting member 25 of the upper electrode 21. The gas inlet opening 26 is connected to a gas supply line 27, which is connected to a processing gas supply unit 30 via a valve 28 and a mass flow controller 29. An etching gas for plasma etching is supplied from the processing gas supply unit 30. Though only one processing gas supplying system constituted by the processing gas supply unit 30 and so on is illustrated in FIG. 2, the plasma treatment apparatus 1 is provided with a plurality of such etching gas supplying systems so that flow rates of, e.g., $Cl_2$, $O_2$ and $NF_3$ gases can be controlled independently before the gases are supplied into the chamber 2.

Connected to the bottom portion of the chamber 2 is a gas discharge tube 31, which in turn is connected with a gas discharge unit 35. The gas discharge unit 35 is provided with such a vacuum pump as a turbo molecular pump and is configured to enable to reduce an inner pressure of the chamber 2 down to a predetermined vacuum level, e.g., 1 Pa or less. Further, a gate valve 32 is installed on the sidewall of the chamber 2. The wafer W is transferred between the chamber 2 and an adjacent load-lock chamber (not shown) while the gate valve 32 is opened.

Connected to the upper electrode 21 via a matching unit 41 is a first high frequency power supply 40. A low pass filter (LPF) 42 is also connected to the upper electrode 21. A frequency of the first high frequency power supply 40 ranges from about 50 to 150 MHz. By applying the high frequency of such a range, a high density plasma with a proper dissociation state can be formed in the chamber 2, so that a plasma process can be performed at a lower pressure compared with conventional cases. A preferable range of the frequency of the first high frequency power supply 40 is 50 to 80 Mhz. Typically, the frequency of the first high frequency power supply 40 is 60 Mhz as shown in FIG. 2 or thereabouts.

The susceptor 5 functioning as the lower electrode is connected to a second high frequency power supply 50 via a matching unit 51. A frequency of the second high frequency power supply 50 ranges from 1 to 20 MHz exclusive. By applying the frequency of such a range, a proper ionic reaction can be made without damaging the wafer W being processed. Typically, the frequency of the second high frequency power supply 50 is 13.56 Mhz as shown in FIG. 2 or thereabouts.

In the following, there will be explained a process for etching the tungsten silicide layer 104 on the wafer W (the silicon substrate 101) by employing the plasma etching apparatus 1 described above.

First, the wafer W (the silicon substrate 101) is carried into the chamber 2 from the load-lock chamber (not shown) by opening the gate valve 32 and mounted on the electrostatic chuck 11. A DC voltage is then supplied from the high voltage DC power supply 13, so that the wafer W is electrostatically adhered to the electrostatic chuck 11.

Next, the gate valve 32 is closed, and then the inner space of the chamber 2 is made into a vacuum state of a predetermined vacuum level by the gas discharge unit 35. Thereafter, the valve 28 is opened and an etching gas of $Cl_2+O_2$ (a first etching gas) is supplied from the processing gas supply unit 30. The first etching gas, a flow rate of which is controlled by the mass flow controller 29, is discharged uniformly towards the wafer W as depicted by arrows in FIG. 2 via the processing gas supply line 27, the gas inlet opening 26, a hollow region of the upper electrode 21 and the injection openings 23 of the electrode plate 24. Meanwhile, the inner pressure of the chamber 2 is maintained at a predetermined pressure and high frequency voltages are supplied to the upper electrode 21 and the susceptor 5 serving as the lower electrode from the first and the second high frequency power supply 40 and 50, respectively. Resultantly, the etching gas is converted into a plasma state and the tungsten silicide layer 104 of the wafer W is etched (main etching).

Subsequently, an end point of the main etching process of the tungsten silicide layer 104 is detected by using an end point detector (not shown). Then, at the moment the wafer gets into a state shown in FIG. 1B, the etching gas is switched to a second etching gas of $Cl_2+O_2+NF_3$ and the overetching is performed for a predetermined time period. The switching of the etching gas can be done while either temporarily stopping the etching process or continuing same without interruption. The overetching process is stopped at the moment the wafer gets into a state shown in FIG. 1C, thereby completing the etching process of the tungsten silicide layer 104.

With respect to the above processes, a first etching process, i.e., the main etching process, was performed under the following condition:

the first etching gas; $Cl_2$ (a flow rate of 33 sccm)+$O_2$ (a flow rate of 2 sccm),
a pressure; 0.67 Pa,
a high frequency power applied to the upper electrode; 475 W,
a high frequency power applied to the lower electrode; 50 W, and
the distance between the electrodes; 150 mm.

A second etching process, i.e., the overetching process, was performed under the following condition:

the second etching gas; $Cl_2$ (a flow rate of 10 sccm)+$O_2$ (a flow rate of 20 sccm)+$NF_3$ (a flow rate of 20 sccm),
a pressure; 1.3 Pa,
a high frequency power applied to the upper electrode; 500 W,
a high frequency power applied to the lower electrode; 100 W, and
the distance between the electrodes; 150 mm.

Figure 3:
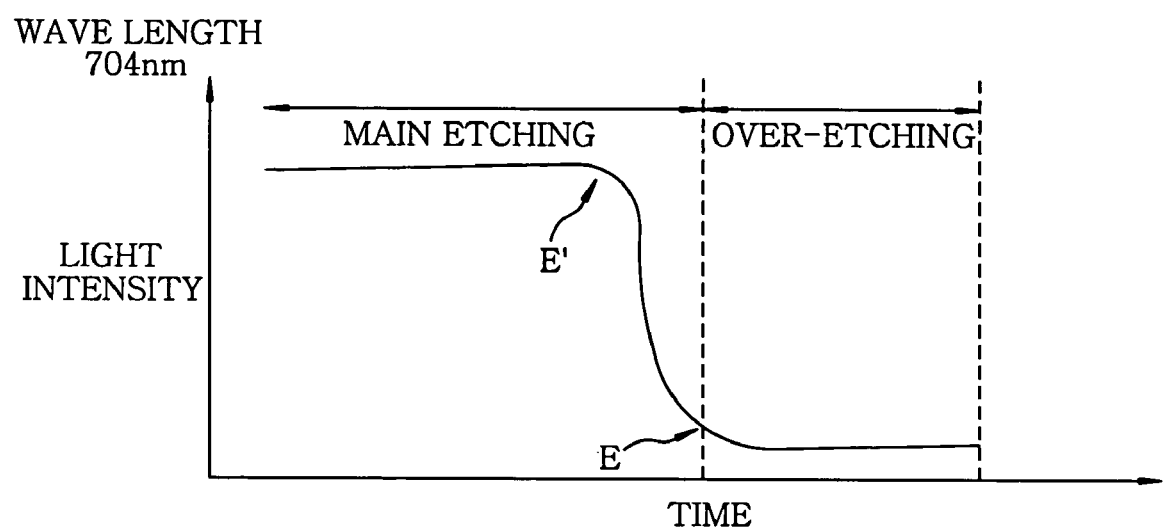
FIG. 3 explains an exemplary end point detection method in the embodiment of the present invention.

The switching of the etching process was carried out by detecting the end point of the etching of the tungsten silicide layer 104 (the end point E of the slope of the curve shown in FIG. 3). The end point was detected by way of detecting the attenuation of the intensity of light having a wavelength of 704 nm as shown in FIG. 3. The second etching process (the overetching process) was about 40% as long as the first etching process (the main etching process).

It is preferable to detect the end point of the first etching process at a timing between E', a moment when the underlying polysilicon layer 103 begins to be exposed, and E, a moment just prior to the completion of etching of the tungsten silicide layer 104. For minimizing the overetching of the polysilicon layer 103, it is preferable to set E' as the end point of the first etching process.

When the etched wafer was observed with a scanning electron microscope (SEM), a patterned shape of the tungsten silicide layer 104 was of good quality and no residue was found. Further, after etching the polysilicon layer 103 after the above process, patterned shapes of the polysilicon and the tungsten silicide layer 103 and 104 were also of good quality and no residue was found.

A selectivity of the tungsten silicide with respect to the polysilicon (an etching rate of the tungsten silicide/an etching rate of the polysilicon) in case of the second etching process was measured to be 2.1 for a blanket (nonpatterned) wafer and 4.4 for a patterned wafer. The selectivities were 1.1 and 1.5, respectively, in case of the first etching process, verifying that the selectivity in the second etching process is improved compared with that in the first etching process.

In the above example, the selectivity (an etching rate of the tungsten silicide/an etching rate of the polysilicon) in case of the second etching process was improved by increasing a flow rate of $O_2$ compared with the first etching process, and $NF_3$ was added during the second etching process to suppress the generation of residues.

Figure 4:
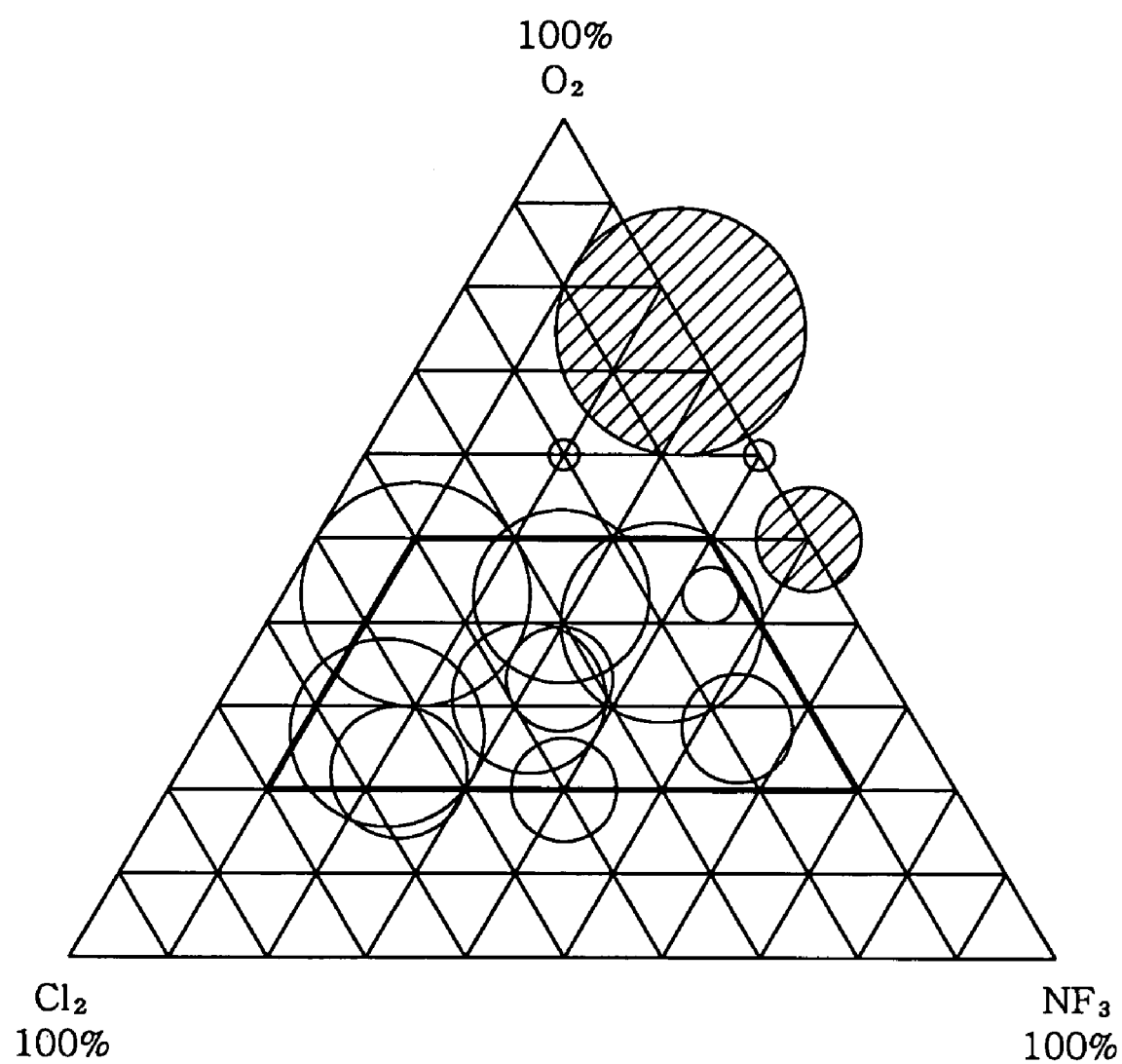
FIG. 4 describes a relationship between a ratio of flow rate and a selectivity.

FIG. 4 describes investigation results of a change of a selectivity (an etching rate of the tungsten silicide/an etching rate of the polysilicon) for a blanket (nonpatterned) wafer as a function of a ratio of gas flow rate.

In FIG. 4, vertices of a triangle designate points where flow rates of $Cl_2$, $O_2$ and $NF_3$ are 100%, respectively, whereas an opposite side of each vertices represents 0%. The ratio of flow rate of each of $Cl_2$, $O_2$ or $NF_3$ is decreased gradually from a vertex to an opposite side thereof. The size of each circle at a position in the triangle designates the magnitude of a selectivity. Each hatched circle represents that a layer thickness was increased due to an occurrence of deposition rather than etching.

As shown in FIG. 4, a deposition, instead of etching, takes place when a ratio of $O_2$ flow rate is too high. Thus, it is preferable to set the gas flow within the range enclosed by bold lines in FIG. 4, i.e., to set ratio of $O_2$ flow rate in a range from 20% to 50%. A selectivity not less than about 1.5 can be obtained for a blanket (nonpatterned) wafer by setting the ratio of $O_2$ flow rates in this range.

As described above, in accordance with the embodiment of the present invention, a residual amount of polysilicon layer can be made uniform compared with the cases in the prior art. Therefore, the underlying oxide film layer can be protected from being damaged during the etching process of the polysilicon layer and thus the breakage of the gate oxide film can be prevented.

Though the above embodiment has been described with respect to the case where the first etching gas is $Cl_2+O_2$, the first etching gas can be any other gas capable of etching the tungsten silicide layer to have a high quality patterned shape without residues. For example, the first etching gas can be another gas containing $Cl_2$, e.g., a $Cl^2+SF_6$ gas. Further, an inert gas, e.g., an Ar gas, can be added to the first and the second etching gas.

In the following, etching a tungsten layer in lieu of the tungsten silicide layer will be described.

Figure 5A:
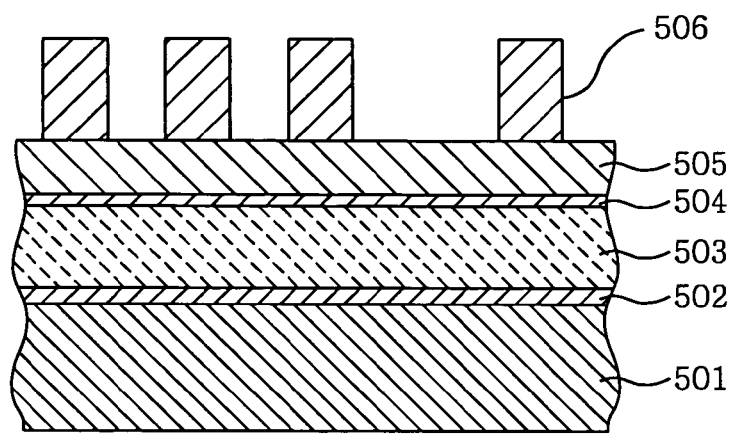
FIG. 5A and 5B provide schematic cross-sectional views of a wafer explaining another embodiment of the present invention.

Referring to FIG. 5A, a gate oxide ($SiO_2$) film 502, a polysilicon layer 503, a barrier metal layer 504 made of, e.g., tungsten nitride, and a tungsten layer 505 are sequentially formed in that order on a silicon substrate 501. A mask layer 506 patterned in a predetermined pattern is formed on the tungsten layer 505. The gate oxide film 502, the polysilicon layer 503, the barrier metal layer 504, the tungsten layer 505 and the mask layer 506 are about, for example, 3.5 nm to 6.5 nm, 80 nm, 4 nm, 35 nm and 150 nm in thickness, respectively.

The mask layer 506, formed of, e.g., a silicon nitride film, has a dense pattern region where adjacent patterns are close to each other as shown in the left position of FIG. 5A and a sparse pattern region where adjacent patterns are spaced apart from each other as shown in the right position of FIG. 5A.

By starting from a state shown in FIG. 5A of the silicon substrate 501, the tungsten layer 505 and the barrier metal layer 504 can be etched in a high quality patterned shape without generating residues by a plasma etching method employing a $Cl_2+O_2+NF_3$ gas as an etching gas. In this case, however, a selectivity of the tungsten to the polysilicon (an etching rate of the tungsten/an etching rate of the polysilicon) is about 1, so that the underlying polysilicon layer 503 is etched a lot, resulting in the considerable reduction in the thickness thereof.

Figure 5B:
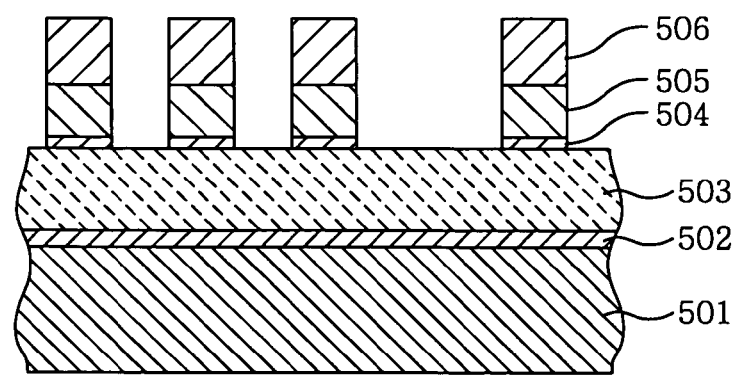

For this reason, an $N_2+O_2+NF_3$ gas is employed as an etching gas during a plasma etching process for the tungsten layer 505 and the barrier metal layer 504 as shown in FIG. 5B. The etching process is finished at the moment the tungsten layer 505 and the barrier metal layer 504 are completely removed and the polysilicon layer 503 is completely exposed.

By doing so, etching can be performed to provide a high quality patterned shape without generating residues; and, in addition to this, the tungsten layer 505 and the barrier metal layer 504 can be completely removed without noticeably etching the polysilicon layer 503, since a selectivity of the tungsten with respect to the polysilicon (an etching rate of the tungsten/an etching rate of the polysilicon) can be raised during the overetching process.

Figure 6A:
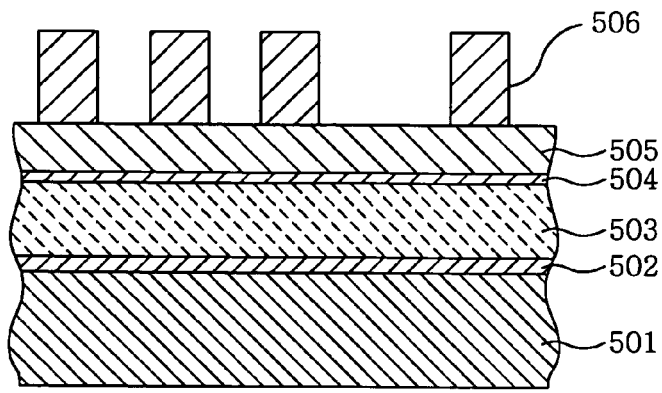
FIG. 6A to 6C present schematic cross-sectional views of a wafer explaining still another embodiment of the present invention.
Figure 6B:
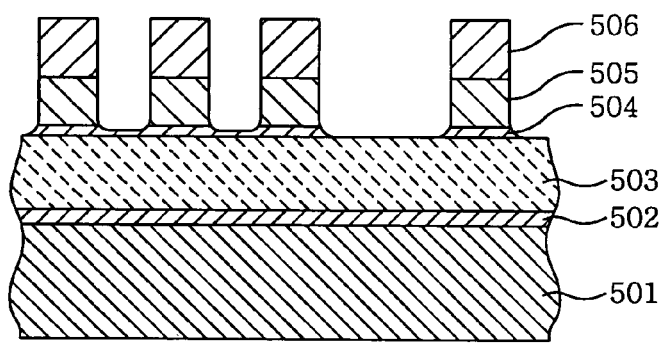
Figure 6C:
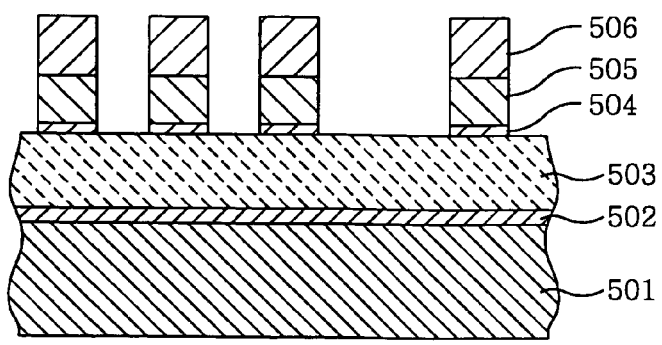

FIG. 6A to 6C illustrate another embodiment of the present invention for etching tungsten. The tungsten layer 505 and the barrier metal layer 504 are etched (a main etching) by employing a $Cl_2+O_2+NF_3$ gas as an etching gas, starting from a state shown in FIG. 6A for a semiconductor wafer (a silicon substrate) of an identical structure to that of the above-mentioned embodiment.

Next, the etching gas is switched to an $O_2+NF_3$ gas having no $Cl_2$ or an $O_2+NF_3$ gas containing a small amount of $Cl_2$, which is less than that in the etching gas used in the above-described process, at the moment the underlying polysilicon layer 503 is exposed at certain parts on the semiconductor wafer as shown in FIG. 6B. Then, an overetching process is performed and the etching process is finished at the moment the polysilicon layer 503 is completely exposed as shown in FIG. 6C.

A transition of the etching process can be made by switching the gas while the plasma remains activated. Alternatively, the etching gas can be switched after turning off the plasma and the plasma can be refired thereafter.

Figure 7:
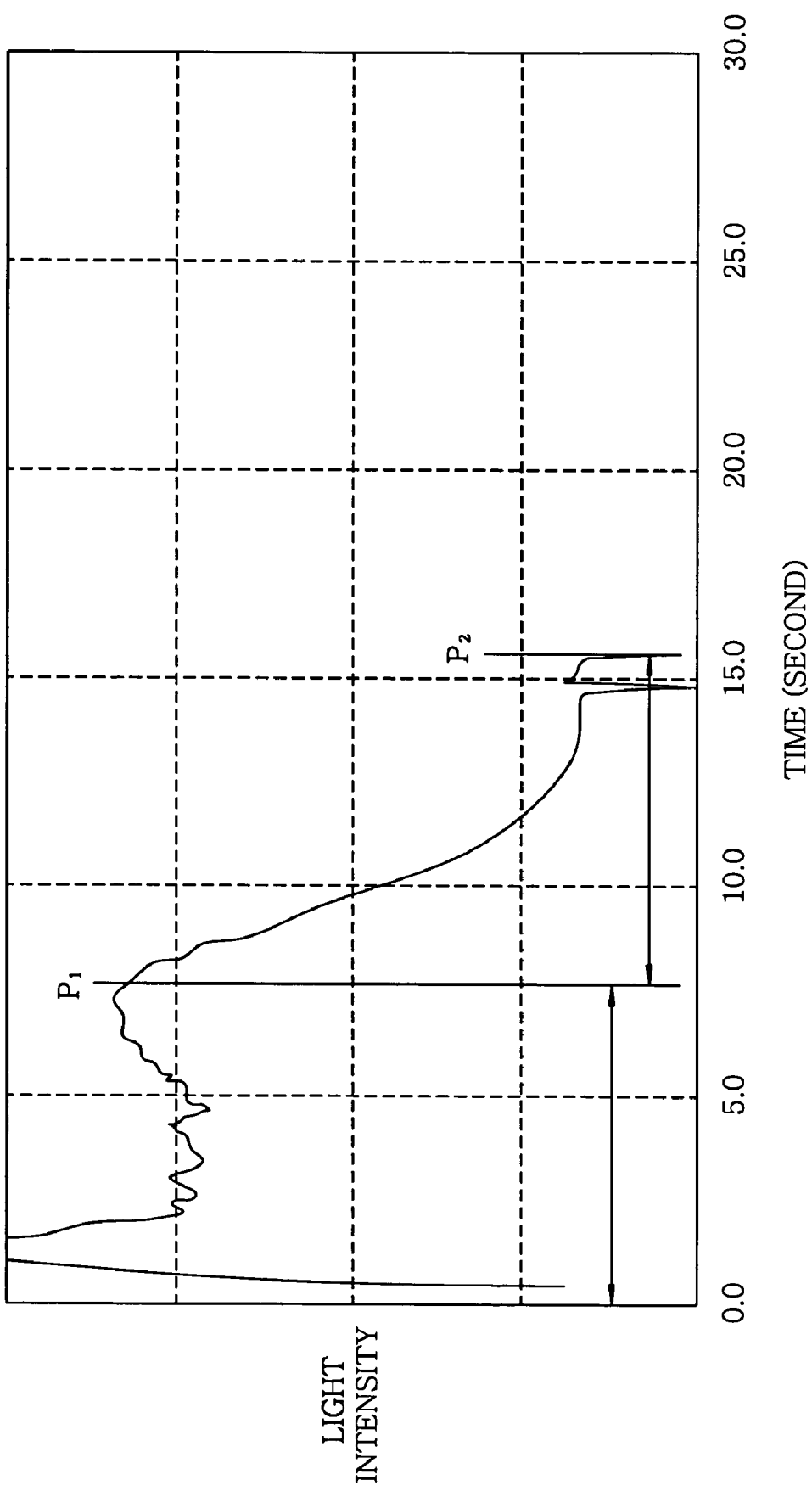
FIG. 7 explains an exemplary end point detection scheme for use in one embodiment of the present invention.

An etching state for the transition of the etching process is detected by detecting a photoemission spectrum of the plasma. That is, the etching state can be detected, for example, by measuring a temporal variation of a light with a specific wavelength (542 nm in the example shown in FIG. 7) in the plasma. As shown in FIG. 7, the etching process is switched at the moment P1 when the intensity of light having such wavelength begins to be attenuated and the etching process is completed at the moment P2 when the intensity of light ceases to be attenuated and remains at a substantially constant level. A light with a wavelength of 578 nm can be chosen instead of 542 nm, which shows conspicuous attenuation in the light intensity at the moment the tungsten nitride or the polysilicon layer is exposed.

In accordance with the embodiment, a selectivity of the tungsten with respect to the polysilicon (an etching rate of the tungsten/an etching rate of the polysilicon) can be raised only during the overetching process, so that the tungsten layer 505 and the barrier metal layer 504 can be completely removed without noticeably etching the polysilicon layer 503.

Hereinafter, another embodiment for etching tungsten will be described. In this embodiment, a tungsten layer 505 is formed directly on a silicon layer 503 and a mask layer 506 patterned in a predetermined pattern is formed on the tungsten layer 505, as shown in FIG. 8A depicting the silicon substrate 501; and the etching process is performed with respect to the tungsten layer 505.

Alternatively, as in the case illustrated in FIGS. 5A and 5B, a barrier metal layer 504 of, e.g., tungsten nitride can be placed between the silicon layer 503 and the tungsten layer 505. Further, the silicon layer 503 can be any of single crystalline silicon, amorphous silicon and polysilicon.

Figure 8A:
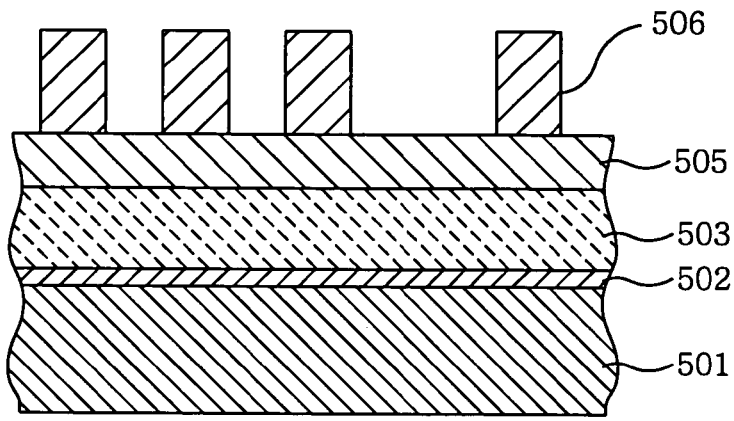
FIG. 8A and 8B depict schematic cross-sectional views of a wafer explaining still another embodiment of the present invention.
Figure 8B:
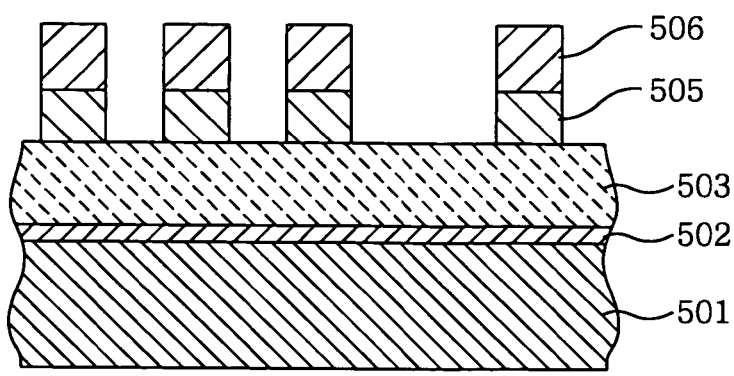

In this embodiment, the tungsten layer 505 (or both of the barrier metal layer 504 formed of, e.g., tungsten nitride and the tungsten layer 505) is etched by a plasma etching method employing an $N_2+NF_3$ gas as an etching gas, starting from a state shown in FIG. 8A. The etching process is terminated at the moment the tungsten layer 505 is completely removed and the silicon layer 503 is completely exposed as shown in FIG. 8B.

By doing so, the tungsten layer 505 can be completely removed without noticeably etching the silicon layer 503, since etching can be accomplished to yield a high quality patterned shape without generating residues and, in addition to this, a selectivity of the tungsten with respect to the silicon (an etching rate of the tungsten/an etching rate of the silicon) can be raised during the overetching process. Moreover, in this embodiment, a very smooth silicon surface can be obtained after the etching of the tungsten layer, compared with the case of employing the $Cl_2+O_2+NF_3$ gas as an etching gas.

Figure 9A:
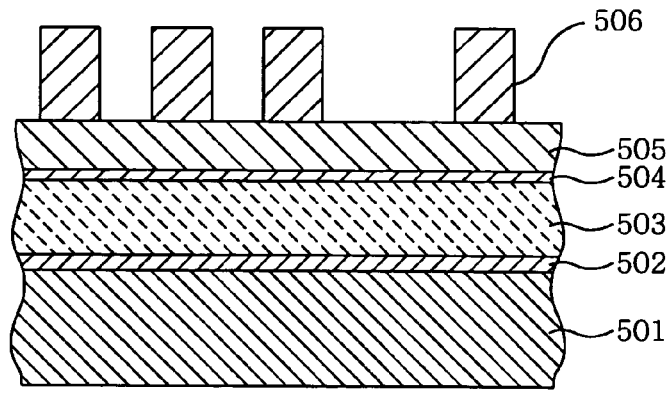
FIG. 9A to 9C show schematic cross-sectional views of a wafer explaining still another embodiment of the present invention.
Figure 9B:
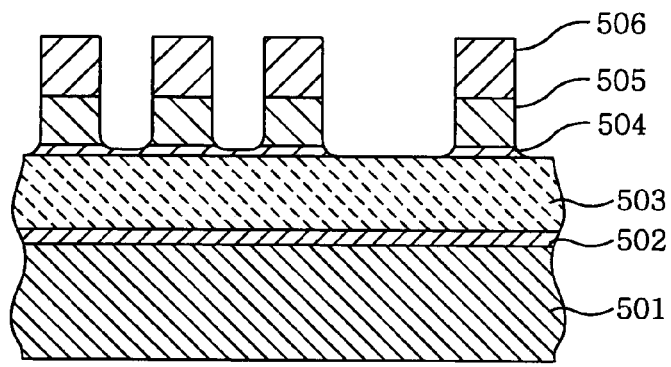
Figure 9C:
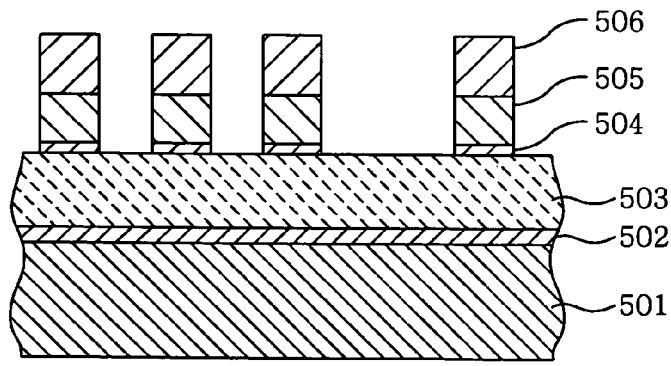
Figure 10A:
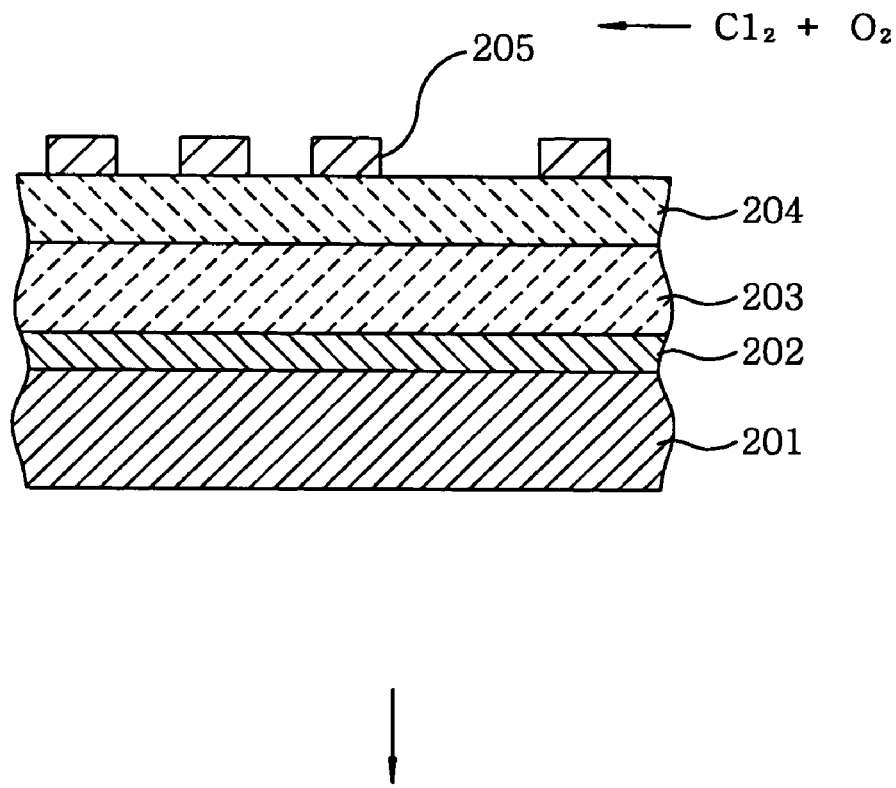
FIG. 10A and 10B are schematic cross-sectional views of a wafer explaining the prior art.
Figure 10B:
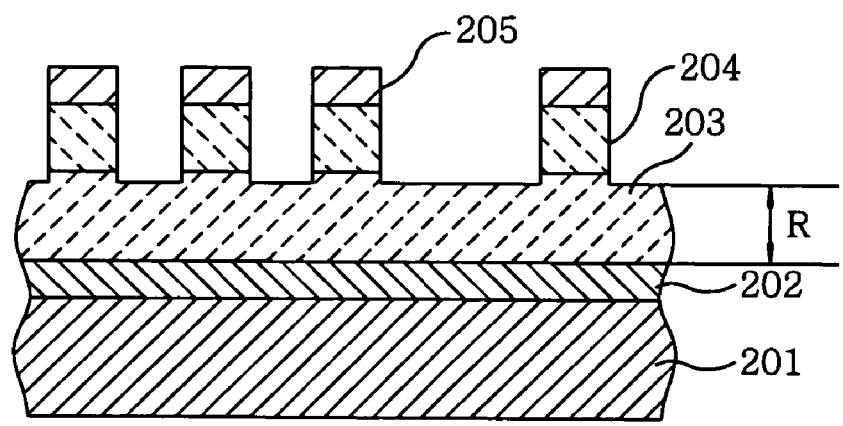

Still another embodiment of a double step etching process for etching tungsten will now be described with reference to FIGS. 9A to 9C. As in the double step etching process shown in FIGS. 6A to 6C, etching is carried out first by way of using a $Cl_2+O_2+NF_3$ gas having a rather high etching rate as shown in FIG. 9B; and then, after the remaining tungsten layer 505 is reduced, etching is performed by employing an $N_2+NF_3$ gas having a rather low etching rate but with a high selectivity as shown in FIG. 9C. This embodiment has a further effect that the etching process can be performed rapidly in addition to all effects of the embodiment shown in FIGS. 6A to 6C.

The tungsten layer 505 and the barrier metal layer 504 were etched with the apparatus shown in FIG. 2 by using the process shown in FIGS. 5A and 5B, i.e., by employing the $N_2+O_2+NF_3$ gas as the etching gas. The result was that the etching rate of the tungsten was 170 nm/min; the etching rate of the polysilicon was 33 nm/min; the selectivity was 5.1; the decrement of the polysilicon layer after completing the etching process was equal to or less than 6 nm; the etching rate of silicon nitride serving as the mask layer was 34 nm/min; and the decrement of the silicon nitride layer after completing the etching process was 12.2 nm. The etching condition was as follows:

gas flow rates of $N_2+O_2+NF_3$; 20/20/20 sccm,
a pressure; 0.67 Pa,
a high frequency power applied to the upper electrode; 500 W,
a high frequency power applied to the lower electrode; 100 W,
the distance between the electrodes; 150 mm,
a pressure of helium gas for temperature control; 2660 Pa, and
a temperature of the susceptor; 60° C.

On the other hand, the result of etching the tungsten layer 505 and the barrier metal layer 504 by employing the $Cl_2+O_2+NF_3$ gas as the etching gas was that the etching rate of the tungsten was 306 nm/min; the etching rate of the polysilicon was 310 nm/min; the selectivity was 1.0; the decrement of the polysilicon layer after completing the etching process was not more than 36.7 nm; the etching rate of silicon nitride serving as the mask layer was 164 nm/min; and the decrement of the silicon nitride layer after finishing the etching process was 36.9 nm. The etching condition was as follows:

gas flow rates of $Cl_2+O_2+NF_3$; 20/20/20 sccm,
a pressure; 0.67 Pa,
a high frequency power applied to the upper electrode; 500 W,
a high frequency power applied to the lower electrode; 150 W,
the distance between the electrodes; 150 mm,
a pressure of helium gas for temperature control; 399 Pa, and
a temperature of the susceptor; 90° C.

In case of employing the $N_2+O_2+NF_3$ gas as the etching gas, the selectivity was 5 times, the decrement of the polysilicon layer was not more than ⅙ and the decrement of the silicon nitride layer serving as the mask layer was about ⅓ as much as those in case of employing the $Cl_2+O_2+NF_3$ gas as the etching gas. Therefore, the underlying gate oxide ($SiO_2$) film could be protected from being damaged while etching the polysilicon layer, and thus the breakage of the gate oxide film can be avoided. In the embodiment employing the $N_2+O_2+NF_3$ gas, the temperature of the susceptor was set to be low and the pressure of helium gas for temperature control was set to be high in order to decrease the temperature of the semiconductor wafer being etched and reduce the amount of side etching. Such temperature control enabled the etching to be carried out while producing a high quality etched pattern shape.

Further, the tungsten layer 505 and the barrier metal layer 504 were etched with the apparatus shown in FIG. 2 by using the double step process shown in FIGS. 6A to 6C, i.e., by employing the $Cl_2+O_2+NF_3$ gas as the etching gas of the first etching process and the $O_2+NF_3$ gas as the etching gas of the second etching process. The result of the second etching process employing the $O_2+NF_3$ gas was that the etching rate of the tungsten was 281 nm/min; the etching rate of the polysilicon was 98 nm/min; the selectivity was 2.9; and the decrement of the polysilicon layer after completing the etching process was not more than 6 nm. During the second etching process, it was possible to suppress the etching of the polysilicon and enhance the selectivity by way of lowering the flow ratio of $Cl_2$ and increasing the flow ratio of $O_2$. The etching condition for the first etching process was the same as that in the above-mentioned case of employing the $Cl_2+O_2+NF_3$ gas. The etching condition for the second etching process was:

gas flow rates of $O_2+NF_3$; 20/20 sccm,
a pressure; 0.67 Pa,
a high frequency power applied to the upper electrode; 500 W,
a high frequency power applied to the lower electrode; 150 W,
the distance between the electrodes; 150 mm,
a pressure of helium gas for temperature control; 399 Pa, and
a temperature of the susceptor; 90° C.

As described above, it was also possible to improve the selectivity and suppress the decrement of the polysilicon layer in the embodiment carried out by the process shown in FIGS. 6A to 6C, compared with the prior art.

Moreover, when the wafer was observed after finishing the etching process with a scanning electron microscope (SEM), a small amount of residues were found. However, such residues could be reduced or removed by prolonging an etching time of the second etching process. It is preferable that the etching time of the second etching process is not more than 30 seconds in order not to augment the decrement of the mask layer. Further, the generation of such residues could be avoided by adding a small amount of $Cl_2$ gas of about 5 sccm to the etching gas of the second etching process. The amount of $Cl_2$ gas added to the etching gas is preferably not more than 12.5% of the sum of the flow rates of $O_2$ gas and $NF_3$ gas so that the addition of $Cl_2$ gas may not decrease the selectivity.

In the above embodiment, there occurred the so-called undercut where a lower portion of the tungsten layer is tapered a little but this could be avoided by increasing the high frequency power applied to the lower electrode to 300 W.

Thus, it is preferable in the second etching process that a small amount of $Cl_2$ gas of about 5 sccm is added and the high frequency power applied to the lower electrode is increased to 300 W.

The tungsten layer 505 was etched with the apparatus shown in FIG. 2 by using the process shown in FIGS. 8A and 8B, e.g., by employing the $N_2+NF_3$ gas as the etching gas. The etching condition was as follows:

gas flow rates of $N_2+NF_3$; 100/20 sccm,
a pressure; 1.33 Pa,
a high frequency power applied to the upper electrode; 300 W,
a high frequency power applied to the lower electrode; 300 W,
a distance between the electrodes; 150 mm,
a pressure of helium gas for temperature control; 400 Pa, and
a temperature of the susceptor; 60° C.

In this embodiment employing the $N_2+NF_3$ gas, it was also found that the selectivity was improved compared with the process of employing the $Cl_2+O_2+NF_3$ gas.

Though the preferred embodiments of the invention have been described with respect to the cases of employing the parallel plate etching apparatus, the present invention is not limited thereto. It should be apparent that any types of plasma etching apparatus can be employed as well.

Industrial Applicability

The dry etching method in accordance with the present invention can be applied to, e.g., a semiconductor industry for manufacturing semiconductor devices. Thus, the present invention has industrial applicability.

What is claimed is:

1. An etching method, comprising the steps of etching tungsten silicide on silicon by employing an etching gas including $Cl_2$ gas and $O_2$ gas and thereafter etching the tungsten silicide on the silicon by employing an etching gas including $Cl_2$ gas, $O_2$ gas and $NF_3$ gas, wherein a ratio of a flow rate of $O_2$ gas to that of $Cl_2$ gas (a flow rate of $O_2$ gas/a flow rate of $Cl_2$ gas) is larger at the etching step employing the etching gas including $Cl_2$ gas, $O_2$ gas and $NF_3$ gas than at the etching step employing the etching gas including $Cl_2$ gas and $O_2$ gas.

2. An etching method, comprising the steps of:
etching tungsten formed directly on a silicon layer by employing an etching gas including $Cl_2$ gas, $O_2$ gas and $NF_3$ gas; and then
etching the tungsten by employing an etching gas including $N_2$ gas, $NF_3$ gas and $O_2$ gas.

3. The method of claim 2, wherein the tungsten is etched by using a silicon nitride layer as a mask.

4. The method of claim 2, wherein the tungsten is etched into a pattern having a dense pattern region where adjacent patterns are close to each other and a sparse pattern region where adjacent patterns are distant from each other.

5. An etching method, comprising the steps of:
etching tungsten formed on silicon by employing a first etching gas including $Cl_2$ gas, $O_2$ gas and $NF_3$ gas; and then
etching the tungsten by employing a second etching gas including $O_2$ gas and $NF_3$ gas, wherein the second etching gas further includes $Cl_2$ gas and a ratio of a flow rate of $Cl_2$ gas in the second etching gas to a total flow rate of the second etching gas is greater than 0 but not larger than 0.125 and wherein a ratio of a flow rate of $Cl_2$ gas in the first etching gas to a total flow rate of the first etching gas is greater than the ratio of the flow rate of the $Cl_2$ gas in the second etching gas to the total flow rate of the second etching gas.

6. The method of claim 5, wherein the etching step employing the first etching gas and the etching step employing the second etching step are performed by using a parallel plate plasma etching apparatus including a lower electrode on which a substrate to be processed is mounted and to which a high frequency power is applied, the high frequency power applied to the lower electrode at the etching step employing the second etching gas is greater than that at the etching step employing the first etching gas.

7. The method of claim 5, wherein a light having a wavelength of about 578 nm or about 542 nm is detected in plasma and the etching step employing the first etching gas and the etching step employing the second etching step are performed according to a change of the detected light.

8. The method of claim 5, wherein a barrier metal layer is placed between the silicon and the tungsten.

9. An etching method, comprising the steps of:
   etching tungsten and a barrier metal layer formed on a silicon layer by employing an etching gas including $Cl_2$ gas, $O_2$ gas and $NF_3$ gas; and then
   etching the tungsten and the barrier metal layer by employing an etching gas including $N_2$ gas, $NF_3$ gas and $O_2$ gas.

10. The method of claim 9, wherein the tungsten is etched by using a silicon nitride layer as a mask.

11. The method of claim 9, wherein the tungsten is etched into a pattern having a dense pattern region where adjacent patterns are close to each other and a sparse pattern region where adjacent patterns are spaced apart from each other.

* * * * *